United States Patent
Sidle et al.

(10) Patent No.: US 7,360,186 B2
(45) Date of Patent: Apr. 15, 2008

(54) INVARIANT CHECKING

(75) Inventors: Thomas W. Sidle, Cupertino, CA (US); Christian Stangier, Los Altos, CA (US); Koichiro Takayama, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 222 days.

(21) Appl. No.: 11/119,443

(22) Filed: Apr. 28, 2005

(65) Prior Publication Data

US 2005/0278669 A1   Dec. 15, 2005

Related U.S. Application Data

(60) Provisional application No. 60/573,359, filed on May 21, 2004.

(51) Int. Cl.
    *G06F 17/50*    (2006.01)
(52) U.S. Cl. .............................. 716/5; 703/16
(58) Field of Classification Search ............... 716/5; 703/16
    See application file for complete search history.

(56) References Cited

U.S. PATENT DOCUMENTS

| | | | | |
|---|---|---|---|---|
| 5,774,370 | A * | 6/1998 | Giomi ........................ | 716/4 |
| 6,035,107 | A * | 3/2000 | Kuehlmann et al. ........... | 716/1 |
| 6,035,109 | A * | 3/2000 | Ashar et al. ................. | 716/3 |
| 6,321,186 | B1 * | 11/2001 | Yuan et al. .................. | 703/15 |
| 6,728,665 | B1 * | 4/2004 | Gupta et al. ................. | 703/2 |
| 6,735,743 | B1 * | 5/2004 | McElvain .................... | 716/4 |

(Continued)

OTHER PUBLICATIONS

Quer et al., "Decomposed symbolic forward traversals of large finite state machines", Proceedings EURO-DAC '96, European Design Automation Conference with EURO-VHDL '96 and Exhibition, Sep. 16-20, 1996, pp. 170-175.*

Iswashita et al., "CTL model checking based on forward state traversal", 1996 IEEE/ACM International Conference on Computer-Aided Design, Nov. 10-14, 1996, pp. 82-87.*

Meinel et al., "Application driven variable reordering and an example implementation in reachability analysis", 1999. Proceedings of the Asia and South Pacific Design Automation Conference, vol. 1, Jan. 18-21, 1999, pp. 327-330.*

Bryant, R.E., Graph-Based Algorithms for Boolean Function Manipulation, IEEE Transactions on Computers, C-35, 1986, pp. 677-691.

*Primary Examiner*—Phallaka Kik
(74) *Attorney, Agent, or Firm*—Baker Botts L.L.P.

(57) ABSTRACT

In one embodiment, a method for invariant checking includes executing one or more first steps of a finite state machine (FSM) corresponding to one or more binary decision diagrams (BDDs) to traverse a state space of the FSM in a first direction with respect to an initial state and an erroneous state. The method also includes, automatically and without user input, accessing a first profile corresponding to the one or more first steps of the FSM, comparing the first profile with one or more first predetermined criteria, stopping the traversal of the state space in the first direction according to the comparison between the first profile and the one or more first predetermined criteria, executing one or more second steps of the FSM to traverse the state space in a second direction with respect to the initial state and the erroneous state opposite the first direction according to a first partial result from the one or more first steps of the FSM, accessing a second profile corresponding to the one or more second steps of the FSM, comparing the second profile with one or more second predetermined criteria, stopping the traversal of the state space in the second direction according to the comparison between the second profile and the one or more second predetermined criteria, and executing one or more third steps of the FSM to traverse the state space in the first direction from the one or more first steps according to a second partial result from the one or more second steps of the FSM.

17 Claims, 2 Drawing Sheets

U.S. PATENT DOCUMENTS

| | | | |
|---|---|---|---|
| 6,885,983 B1* | 4/2005 | Ho et al. | 703/14 |
| 7,149,663 B1* | 12/2006 | Barrett | 703/2 |
| 7,203,631 B2* | 4/2007 | Fraer et al. | 703/14 |
| 7,216,312 B2* | 5/2007 | Jain et al. | 716/4 |
| 7,219,048 B1* | 5/2007 | Xu | 703/19 |
| 7,257,786 B1* | 8/2007 | Kukula | 716/5 |
| 7,260,800 B1* | 8/2007 | Koelbl et al. | 716/5 |
| 7,280,993 B2* | 10/2007 | Jain | 706/47 |
| 7,281,225 B2* | 10/2007 | Jain et al. | 716/5 |
| 7,283,945 B2* | 10/2007 | Rajan | 703/17 |
| 2002/0023256 A1* | 2/2002 | Seawright | 716/18 |
| 2004/0049371 A1* | 3/2004 | Fraer et al. | 703/14 |
| 2004/0148150 A1* | 7/2004 | Ashar et al. | 703/14 |
| 2005/0138474 A1* | 6/2005 | Jain et al. | 714/30 |
| 2005/0149837 A1* | 7/2005 | Jain | 714/794 |
| 2006/0173666 A1* | 8/2006 | Jain et al. | 703/14 |

OTHER PUBLICATIONS

Burch et al., "Symbolic Model Checking with Partitioned Transition Relations," Proc. of Int. Conf. on VLSI, 1991, pp. 49-58.

Brayton et al., "VIS: A System for Verification and Synthesis," Proc. of Computer Aided Verification (CAV '96) 1996, pp. 428-432.

Coudert et al., "Verification of Synchronous Machines using Symbolic Execution," Proc. of Workshop on Automatic Verification Methods for Finite State Machines, LNCS 407, Springer, 1989, pp. 365-373.

Cabodi et al., "Efficient State Space Pruning in Symbolic Backward Traversal," Proc. of ICCD, 1994, pp. 230-235.

Cabodi et al., Mixing Forward and Backward Traversals in Guided-Prioritized BDD-Based Verification, Proc. of CAV, 2002, pp. 471-484.

Fortune et al., "The Complexity of Equivalence and Containment for Free Single Variable Program Schemes," Proc. of ICALP, 1978, pp. 227-240.

Govindaraju et al., "Verification by Approximate Forward and Backward Reachability," Proc. ICCAD, 1998, 5 pages.

Iwashita et al., "Forward Model Checking Techniques Oriented to Buggy Designs," Proc. ICCAD, 1997, 5 pages.

Somenzi et al., CUDD: CU Decision Diagram Package, ftp://vlsi.colorado.edu/pub/, 52 pages, no date.

Thomas et al., "The Verilog Hardware Description Language," Kluwer, 1991, 256 pages.

VIS Verilog Benchmarks, vlsi.colorado.edu/~, 1 page, no date.

* cited by examiner

INVARIANT CHECKING

RELATED APPLICATION

This application claims the benefit, under 35 U.S.C. § 119(e), of U.S. Provisional Application No. 60/573,359, filed May 21, 2004.

TECHNICAL FIELD OF THE INVENTION

This invention relates generally to designing circuits and more particularly to invariant checking.

BACKGROUND

Invariant checking based on ordered binary decision diagrams (OBDDs) is a preferred method for checking assertions in the design of a circuit. OBDD-based invariant checking provides both falsification and verification, as opposed to bounded model checking (BMC) for example. This may be important, for example, in cases of abstraction refinement, where, after a series of false negatives and subsequent refinements, a property finally proves correct. OBBD-based invariant checking allows traversal in two directions: forward from initial states or backward from possible error states. One direction may provide significantly more efficient computation. As an example, one direction may reach a fixpoint in fewer steps. As another example, one direction may require significantly less computational complexity. However, a user does not know in advance which direction may provide more efficient computation.

SUMMARY

According to the present invention, disadvantages and problems associated with invariant checking used for designing circuits may be reduced or eliminated.

In one embodiment, a method for invariant checking includes executing one or more first steps of a finite state machine (FSM) corresponding to one or more binary decision diagrams (BDDs) to traverse a state space of the FSM in a first direction with respect to an initial state and an erroneous state. The method also includes, automatically and without user input, accessing a first profile corresponding to the one or more first steps of the FSM, comparing the first profile with one or more first predetermined criteria, stopping the traversal of the state space in the first direction according to the comparison between the first profile and the one or more first predetermined criteria, executing one or more second steps of the FSM to traverse the state space in a second direction with respect to the initial state and the erroneous state opposite the first direction according to a first partial result from the one or more first steps of the FSM, accessing a second profile corresponding to the one or more second steps of the FSM, comparing the second profile with one or more second predetermined criteria, stopping the traversal of the state space in the second direction according to the comparison between the second profile and the one or more second predetermined criteria, and executing one or more third steps of the FSM to traverse the state space in the first direction from the one or more first steps according to a second partial result from the one or more second steps of the FSM.

Particular embodiments of the present invention may provide one or more technical advantages. As an example, particular embodiments provide a dynamic approach based on OBDDs for interleaving forward and backward traversal with each other. This approach may facilitate selecting the shorter direction and, at the same time, limit overhead attributable to redundant computation. Particular embodiments may use two OBDDs with different variable orders, which may provide improved completion at the cost of some additional overhead. These approaches may result in significant gain in efficiency over unidirectional traversal. Particular embodiments perform forward and backward traversal simultaneously in a single pass, while previous approaches typically use one sweep to approximate or to prune the search space and then another sweep in the other direction to perform the actual verification or they even iterate this process. Particular embodiments may replace standard forward traversal algorithms.

Particular embodiments may provide all, some, or none of the technical advantages described above. Particular embodiments may provide one or more other technical advantages, one or more of which may be apparent, from the figures, descriptions, and claims herein, to a person having ordinary skill in the art.

BRIEF DESCRIPTION OF THE DRAWINGS

To provide a more complete understanding of the present invention and the features and advantages thereof, reference is made to the following description, taken in conjunction with the accompanying drawings, in which.

DESCRIPTION OF EXAMPLE EMBODIMENTS

Figure 1:
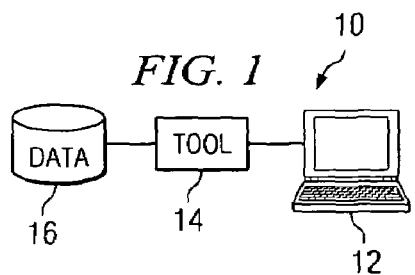
FIG. 1 illustrates an example system for invariant checking.

FIG. 1 illustrates an example system 10 for invariant checking. Reference to a design encompasses a design of a hardware component, such as a digital circuit including multiple digital components, where appropriate. System 10 includes a computer system 12, a tool 14, and data 16. Computer system 12 may enable a user to provide input to and receive output from verification tool 14. As described below, tool 14 may attempt to verify one or more properties of a design, falsify one or more properties of the design, or both. Tool 14 may use data 16 to attempt the verification, the falsification, or both. Tool 14 may include hardware, software, or both for attempting to verify one or more properties of a design, falsify one or more properties of the design, or both. Although computer system 12, tool 14, and data 16 are illustrated and described as being separate from each other, the present invention also contemplates two or more of computer system 12, tool 14, and data 16 being combined with each other to any suitable degree. As an example and not by way of limitation, in particular embodiments, tool 14 may be a software component of computer system 12 and data 16 may be stored at computer system 12.

The increasing complexity of sequential systems requires efficient techniques to be able to perform reachability analysis. Since the set of reachable states can be quite large, an explicit representation of this set, e.g., in the form of a list, is unsuitable under any circumstances. An OBDD can represent a characteristic function of a state set. Such symbolic representation form works well with operations performed to compute reachable states: If reachable states are computed according to a breadth-first traversal, the representation via the characteristic function allows computation of all corresponding successor states within a single computation. For this reason, the term "symbolic breadth-first traversal" is often used. The complexity of the computation depends on the size of the OBDD of the occurring state sets.

Invariant checking is a straightforward formal-verification application based on state-space traversal. Properties that globally hold at all times are checked, e.g., overflow=0. If, during state space traversal, a state is reached that violates the property, the traversal is terminated and returns failed. If the traversal reaches a fixpoint without finding a property violating state, the traversal returns passed.

Computation of the reachable states is a core task for optimization and verification of sequential systems. The essential part of OBDD-based traversal techniques is the transition relation:

$$TR(x, y, e) = \prod_i \delta_i(x, e) \equiv y_i,$$

which is the conjunction of the transition relations of all latches. $\delta_i$ denotes the transition function of the ith latch, and x, y, and e represent a present state, a next state and input variables. This monolithic transition relation is represented as a single OBDD and is usually too large to allow computation of the reachable states. Sometimes, a monolithic transition relation is even too large for a representation with multiple OBDDs. Therefore, more sophisticated reachable states computation methods make use of a partitioned transition relation, i.e., a cluster of OBDDs that each represent the transition relation of a group of latches. A transition relation partitioned over sets of latches $P_1, \ldots, P_j$ is describable as follows:

$$TR(x, y, e) = \prod_j TR_j(x, y, e),$$

where $$TR_j(x, y, e) = \prod_{i \in P_j} \delta_i(x, e) \equiv y_i.$$

The reachable states computation consists of repeated image computations Img(TR, R) of a set of already reached states R:

$$Img(TR,R) = \exists_{x,y}(TR(x,y,e) \cdot R)$$

With the use of a partitioned transition relation the image computation can be iterated over $P_i$ and the $\exists$ operation can be applied during the product computation (early quantification):

$$Img(TR,R) = \exists_{v^j}(TR_j \cdot \ldots \cdot \exists_{v^2}((TR_2 \cdot \exists_{v^1}(TR_1 \cdot R) \ldots))$$

where $v^i$ are those variables in $(x \cup e)$ that do not appear in the following $TR_k$, (i<k≦j).

An AndExist or an AndAbstract operation performs an AND operation on two functions (partitions here) while simultaneously applying existential quantification $(\exists_{x_i} f = (f_{x_i=1} \vee f_{x_i=0}))$ on a given set of variables, i.e., the variables that are not in the support of the remaining partitions. Unlike a conventional AND operation, the AndExist operation has only an exponential upper bound for the size of the resulting OBDD, but, for many practical applications, prevents OBBD size from blowing up during image computation.

A standard method for finding a schedule for conjuncting the partitions together is the IWLS95 method, which uses a greedy scheme to minimize the number of variables involved in the AndExist operation. The IWLS95 method is also a standard method for partitioning in the VIS package.

Forward traversal and backward traversal are equally applicable to an invariant checking problem. Experience shows that traversal direction often significantly affects the complexity of the invariant checking problem. Difficulty lies in the impossibility of detecting in advance which method is preferabable over the other. Particular embodiments of the present invention use a heuristic that combines forward traversal and backward traversal with each other by selecting a direction on the fly.

Figure 2A:
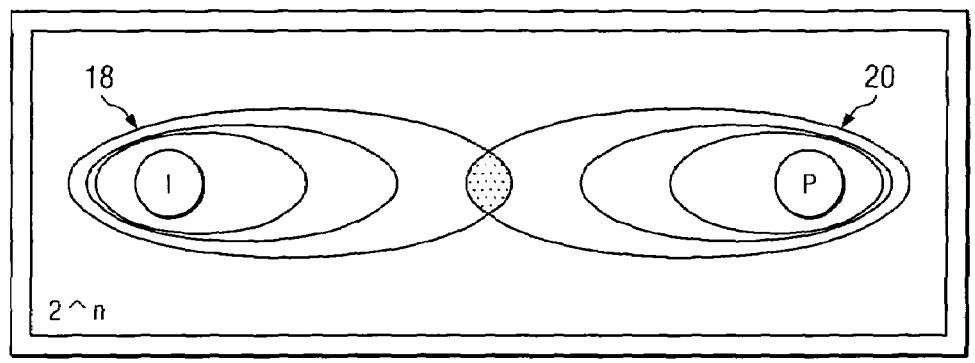
FIGS. 2A and 2B illustrate example combinations of forward and backward traversals.
Figure 2B:
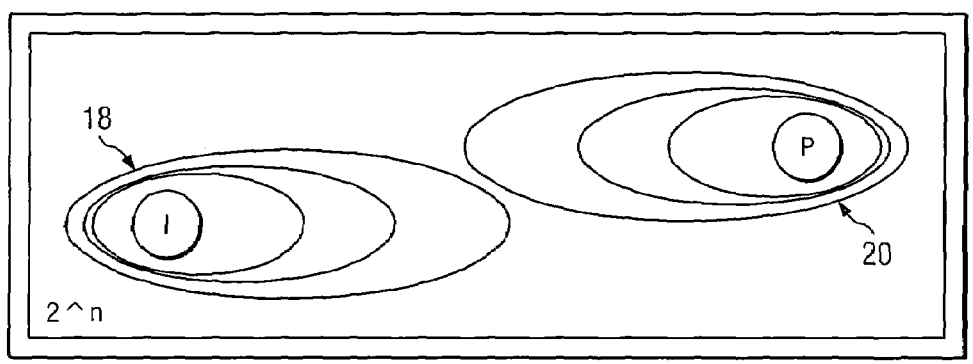

FIGS. 2A and 2B illustrate example combinations of forward and backward traversals. Forward search 18 extends the explored reachable state space by adding "onion rings" according to a breadth-first search (BFS) starting from the initial states I. Backward search 20 extends the state set from reachable failing states by repeating preimage computations starting with the property-violating states P. In FIG. 2A, in the case of a failing property, forward search 18 eventually intersects backward search 20. The number of onion rings determines the depth of the error. Two special cases may occur: (1) the reachable state space may cover all possible states, i.e., $2^n$ states if n state bits are given, thus including all states violating the property under consideration; (2) the failing states set may cover all $2^n$ possible states, thus including all initial and reachable states. In FIG. 2B, in the case of a passing property, forward search 18 and backward search 20 each reach a fixpoint without intersecting each other. However, if either forward search 18 or backward search 20 terminates having reached a fixpoint, the property is proven correct.

A combined traversal approach has at least the following advantages. Such an approach facilitates selection of the computationally cheaper direction. Such an approach facilitates selection of the direction that will likely reach a fixpoint in fewer computational steps. Because the traversals will eventually intersect each other in the case of a failing property, no computation is redundant; they all contribute to the solution. However, none of the above is known in advance. Combined traversal requires properly addressing the following issues. Because one direction will reach a fixpoint before the other in the case of a passing property, computations on the not-converged direction are redundant; they do not contribute to the solution. The cost of computation for the two directions may be so unbalanced that even trying one direction may turn out to be extremely expensive. Having two state sets represented as OBDDs increases the overall complexity of the problem.

In particular embodiments, an interleaving heuristic attempts to maximize the above advantages of combined traversal and, at the same time, address the above issues. The interleaving heuristic determines the traversal direction dynamically by evaluating the cost associated with computing an image or a preimage. The cost metric is the largest OBDD size during the iteration over the partitioned transition relation in preimage computation. In the first step, the interleaving heuristic computes an image in each direction to determine initial costs. In the following steps, the computation proceeds in the direction having the lower cost in its last execution, i.e., execution proceeds in one direction until its cost exceeds the cost of the last image in the other direction.

The decision-making up to this point requires no manual setting of parameters, which provides a fully dynamic and self-adjusting process. Normally, costs associated with forward traversal and costs associated with backward traversal differ from each other significantly. As a result, the interleaving heuristic tends to chose the better direction. To exploit this imbalance even more, a threshold limiting the maximum cost of an image computation may be used. If this threshold is exceeded during an operation, the image computation is aborted and the interleaving heuristic disables bidirectional traversal and returns to unidirectional traversal in the direction not aborted. This threshold facilitates avoidance of prohibitively expensive computation in one direction. This threshold may be set conservatively (to a very large value) so that image computation is aborted only when one direction disproportionately exceeds its share of available memory.

A threshold may be used to avoid a traversal direction causing memory overflow. If set relatively aggressively, such a threshold may also be used as a parameter for tuning the application. For circuits, where the cost for different traversal directions is very unbalanced, a lower threshold can significantly reduce time spent computing an image in the more expensive direction. For circuits that show a certain systematic behavior, a lower threshold improves efficiency.

In particular embodiments, the following example algorithm is the main loop of the interleaving algorithm:

```
while(!fwd_terminated && !bwd_terminated &&
        !Intersect(reach, fail)){
    if(steps == 0){
        newreach = image(reach);
        newfail = preimage(fail);
        update(newreach, reach, fwd_cost, fwd_limit_exceeded,
            fwd_terminated);
        update(newfail , fail , bwd_cost, bwd_limit_exceeded,
            bwd_terminated);
    } else if(fwd_limit_exceeded){
        newfail = preimage(fail);
        update(newfail , fail , bwd_cost, bwd_limit_exceeded,
            bwd_terminated);
    } else if(bwd_limit_exceeded){
        newreach = image(reach);
        update(newreach, reach, fwd_cost, fwd_limit_exceeded,
            fwd_terminated);
    } else if(fwd_cost < bwd_cost){
        newreach = image(reach);
        update(newreach, reach, fwd_cost, fwd_limit_exceeded,
            fwd_terminated);
    } else { /* bwd_cost ≤ fwd_cost) */
        newfail = preimage(fail);
        update(newfail , fail , bwd_cost, bwd_limit_exceeded,
            bwd_terminated);
    }
    steps++;
}
```

Figure 3:
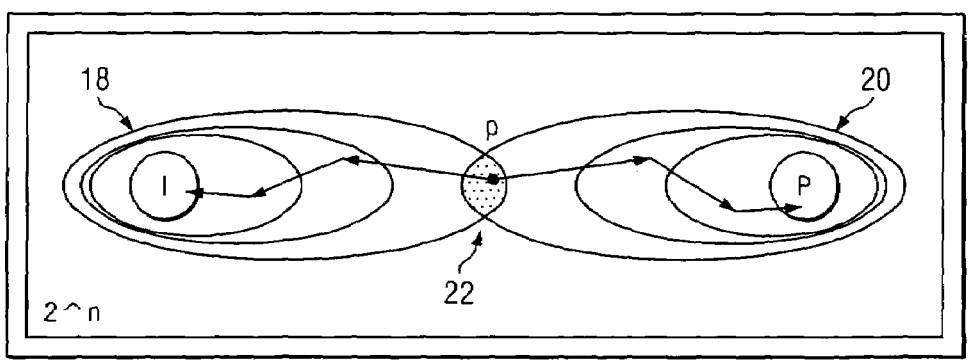
FIG. 3 illustrates example computation of an error trace for interleaving in the case of a failing property.

FIG. 3 illustrates example computation of an error trace for interleaving in the case of a failing property. The computation of an error trace (or counter example) in case of a failing property is more complex for interleaving than for plain forward or backward traversal. In the case of a failing property, the states computed in forward traversal 18 and the states computed in backward traversal 20 overlap in area 22. From this intersection, an arbitrary pivot state p is chosen. This state is reachable from the initial state, and a state violating the property can be reached from this state. The error trace leads from an initial state in I to pivot state p and from there to a state in P. The computation of the error trace requires that, for both traversals, the onion rings, i.e., the frontier states of each iteration, are stored. The first part of the error trace (from p to p) is computed using preimage computation starting from p going backward to I and restricting the result to the onion rings. For each iteration, an arbitrary state from the particular onion ring is chosen. The second part of the error trace (from p to P) is computed in a similar manner using image computation starting from p going to P. Both parts are then combined to form a complete error trace. Storing the onion rings of the computation adds overhead to the computation. This overhead may be smaller for interleaving than for unidirectional approaches. A reason for this may lie in the fact that interleaving chooses the cheaper direction. Thus, storing the onion rings may become more efficient.

The presence of two transition relations and two completely different state sets (reachable and failing states) complicates representation and may lead to significant overhead in the size of the OBDD. The AndExist operation during image computation tends to dominate the variable reordering process and thus the resulting variable order. Having two searches and two AndExist operations with requirements that are different from the variable ordering in the OBDD may adversely affect performance by generating large OBDDs in one direction or by back-and-forth reordering resulting from the two AndExist operations. In particular embodiments, a solution to these problems is to use two OBDDs different from each other having variable orders different from each other: one OBDD for the forward traversal and another OBDD for the backward traversal.

An advantage of using two OBDDs is that only one traversal is performed in each OBDD and thus only one major state set has to be represented. As a result, variable reordering produces better results, since the variable reordering is targeted to only one AndExist operation. This advantage, in many cases, tends to outweigh disadvantages associated with an OBDD approach that uses two OBDDs. Two OBDDs having variable orders that are different from each other cannot share any nodes with each other. In the worst case, this may lead to a blow up on the order of a factor of two. But, in the best case, the representation of two functions different from each other can be exponentially smaller. Initializing and maintaining two OBDDs generates overhead. For smaller cases, such overhead may be significant. Available memory should be allocated to the two OBDDs. This may be problematic, since it is not obvious how much memory each OBDD will require and various caches and stacks may come into play.

Detecting a failing property in a computed intersection between a reachable state set and a failing state set requires communication between OBDDs. FIG. 2A illustrates an example failing property, as described above. The intersection between two OBDDs having variable orders different from each other is, in the worst case, exponential. Particular embodiments use the following example algorithm to check for the existence of an intersection and thus tunnel communication from one OBDD to the other.

```
CrossIntersectRecur (f,g){
    // Trivial cases
    if ( f==0-sink || g==0-sink ) return 0;
    if ( f==1-sink && g!=0-sink ) return 1;
```

```
            if ( g==1-sink && f!=0-sink) return 1;
            if(lookup(f,g)) return 0;// Lookup computed table
            // Recursive step
            // Find first index on which f depends
            topf = f→index; // Index of root node of f
            g1 = Compose(g, topf, 1);
            res1 = IntersectRecur(f→then , g1);
            if (res1) return 1;
            g0 = Compose(g, topf, 0);
            res0 = CrossIntersectRecur(f→else, g0);
            if (res0) return 1;
            insert(f, g, 0) // Insert result 0 in computed table
            return 0; // No intersection found
        }
```

The above algorithm checks whether the OBDD F representing f the OBDD G representing g share with each other an assignment evaluating to one. In this case, the algorithm returns true. If no such assignment exists, the algorithm returns false. The algorithm traverses w.l.o.g F in BFS order, symbolically testing all fulfilling assignments. Because g is represented in G in a different variable order, g cannot simply be traversed in parallel. Instead, g is decomposed by the current branching variable in the recursion of f. If, at the current recursion point (F', G'), the top node of F' has index $x_i$, the following recursion pairs will be (F'$|_{x_i=0}$, G'$|_{x_i=0}$) and (F'$|_{x_i=1}$, G'$|_{x_i=1}$). The algorithm terminates returning true whenever a pair (true, true) can be reached. The runtime for this algorithm may, in the worst case, be exponential. This may happen, for example, when g has an exponential OBDD size in the variable order of OBDD F and f is dense, i.e., each variable is tested on every path in F.

Whenever f is not dense the computation becomes much simpler. The above algorithm may have an average runtime comparable to the runtime of the ITE operation for OBDDs. The computed table of the above algorithm may be implemented as a cache analogous to the ITE operation, limiting the maximal memory consumption of the computed table. In particular embodiments, knowing whether the OBDDs intersect is sufficient for the above applications. Computation of the intersection itself is not required. As a side product of the algorithm, a single satisfying assignment of the intersection can easily be computed. In particualr embodiments, the two-OBDD approach uses the same heuristics and metrics as a single-OBDD interleaving method.

In particular embodiments, invariant (or assertion) checking involves finding a path of state transitions from an initial state to an erroneous state or to the prove that no such path exists. Interleaved invariant checking starts from two points: (1) the initial states of the system and (2) the possible error states (or bad states) specified by the property. In a first step, iterations for both starting points are computed, i.e., the states reachable after one iteration from the initial states of the system and the states from which the possible error states can be reached within one transition are computed. This first step serves as a measure to obtain the cost related to the computation for each direction. The cost is represented by the maximum number of binary decision diagram (BDD) nodes during the iterated image computation. Other cost metrics representing the effort needed to compute an image may be sufficient.

In particular embodiments, in subsequent steps of the computation, forward and backward computations are interleaved, e.g., iterations in one direction are performed until the cost exceeds the cost of the last iteration in the other direction. Additionally, computation in one direction may be aborted if the computation gets too costly, e.g., it exceeds a certain size limit. In that case, computation in that direction is suspended and the computation proceeds in one direction. The computation finishes if: one or more of the following occurs.

1. All states are reachable from the initial states (failure of property).
2. All states are bad states (failure).
3. Reachable and bad states intersect (failure).
4. Forward traversal converges without reaching bad states (passing of property).
5. Backward traversal converges without reaching reachable states (passing).

In particular embodiments, for the construction of error traces (witnesses) of property failure, a path from an initial to an error state may be constructed using the forward computation, the backward computation, or both.

As described above, in particular embodiments, there are two ways of checking invariants:

1. Traversing from the initial states towards possible error states (forward).
2. Traversing from the error states towards the initial states (backward).

One direction may be preferable over the other for one or more of the following reasons:

1. One direction might converge in fewer steps than the other.
2. One direction might reach all states in fewer steps than the other.
3. The cost of computation for one direction could be a lot less than for the other.

There may be no way to determine in advance whether one of the above might occur and how costly the computation may be. In particular embodiments, this is where the advantage of interleaved invariant checking lies. Because interleaved invariant checking dynamically decides in which direction to go, it is more likely to choose the more efficient direction. Also, by using dynamic cost measurements, no fixed thresholds are required. Thus, the method scales independent of the size of the underlying BDDs. Additionally, if the property fails, the computations in both the forward direction and the backward direction are used together to compute an error trace. Thus no computation is wasted.

Figure 4:
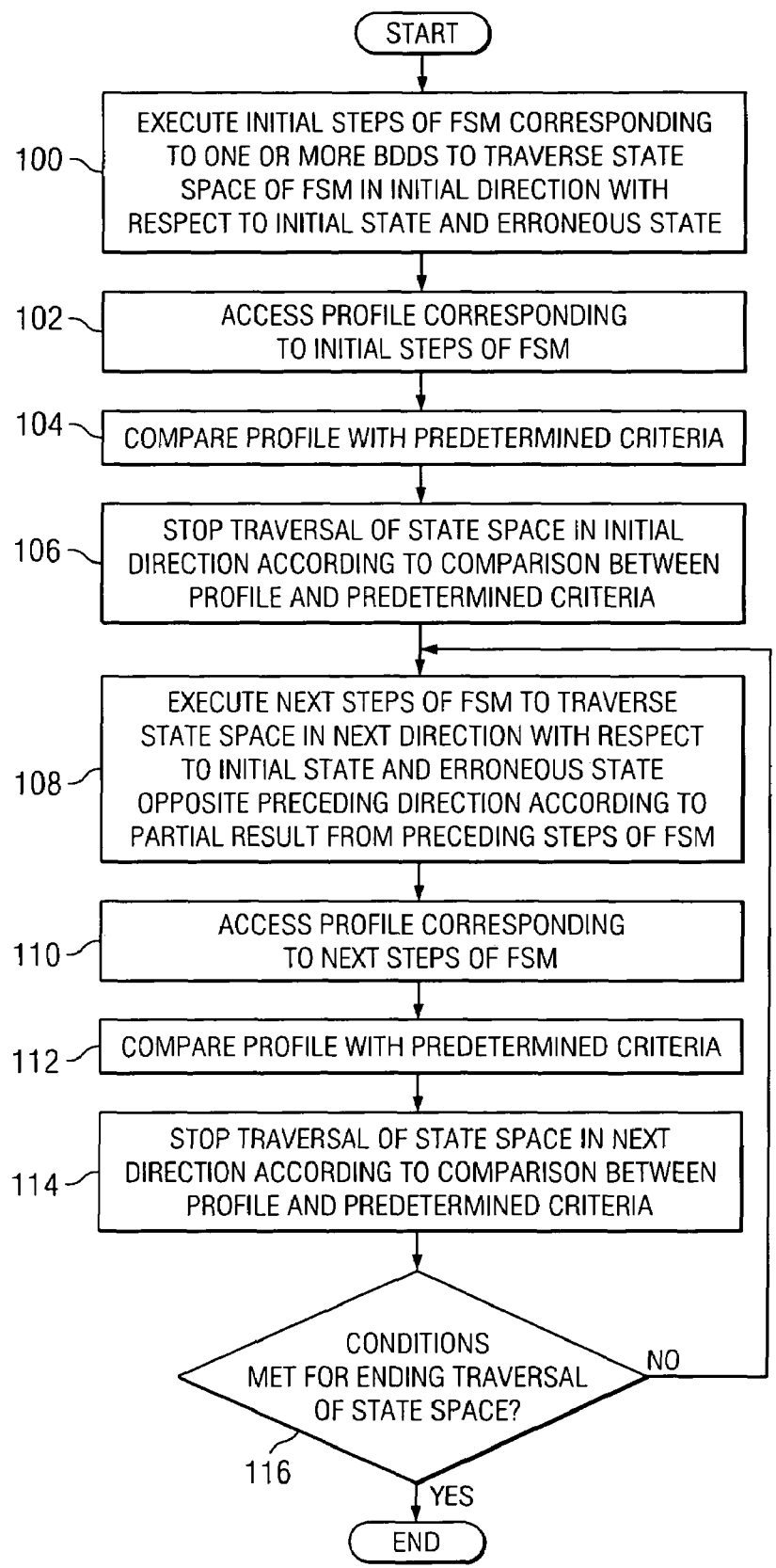
FIG. 4 illustrates an example method for invariant checking.

FIG. 4 illustrates an example method for invariant checking. The method begins at step 100, where tool 14 executes one or more initial steps of a FSM corresponding to one or more BDDs to traverse a state space of the FSM in an initial direction with respect to an initial state and an erroneous state. At step 102, tool 14 accesses a profile corresponding to the one or more initial steps of the FSM. At step 104, tool 14 compares the profile with one or more predetermined criteria. At step 106, tool 14 stops the traversal of the state space in the initial direction according to the comparison between the profile and the one or more predetermined criteria. At step 108, tool 14 executes one or more next steps of the FSM to traverse the state space in a next direction with respect to the initial state and the erroneous state opposite the preceding direction according to a partial result from the one or more preceding steps of the FSM. At step 110, tool 14 accesses a profile corresponding to the one or more next steps of the FSM. At step 112, tool 14 compares the profile with one or more predetermined criteria. At step 114, tool 14 stops the traversal of the state space in the next direction according to the comparison between the profile and the one or more predetermined criteria. At step 116, if conditions for ending the traversal of the state space of the FSM are met, the method ends. At step 116, if conditions for ending the traversal of the state space of the FSM are not met, the method returns to step 108. Although particular steps of the method illustrated in FIG. 4 have been illustrated and described as occurring in a particular order, the present invention contemplates any suitable steps of the method illustrated in FIG. 4 occurring in any suitable order.

One or more modifications to the present invention may be apparent to a person having ordinary skill in the art, and the present invention encompasses all such modifications that are within the scope of the appended claims. Statements in the specification that are not reflected in the appended claims do not limit the present invention.

What is claimed is:

1. A method for invariant checking, the method comprising:
   executing one or more first steps of a finite state machine (FSM) corresponding to one or more binary decision diagrams (BDDs) to traverse a state space of the FSM in a first direction with respect to an initial state and an erroneous state;
   automatically and without user input, accessing a first profile corresponding to the one or more first steps of the FSM;
   automatically and without user input, comparing the first profile with one or more first predetermined criteria;
   automatically and without user input, stopping the traversal of the state space in the first direction according to the comparison between the first profile and the one or more first predetermined criteria;
   automatically and without user input, executing one or more second steps of the FSM to traverse the state space in a second direction with respect to the initial state and the erroneous state opposite the first direction according to a first partial result from the one or more first steps of the FSM;
   automatically and without user input, accessing a second profile corresponding to the one or more second steps of the FSM;
   automatically and without user input, comparing the second profile with one or more second predetermined criteria;
   automatically and without user input, stopping the traversal of the state space in the second direction according to the comparison between the second profile and the one or more second predetermined criteria; and
   automatically and without user input, executing one or more third steps of the FSM to traverse the state space in the first direction from the one or more first steps according to a second partial result from the one or more second steps of the FSM.

2. The method of claim 1, wherein the one or more BDDs collectively correspond to one or more hardware components, one or more software components, or one or more embedded-logic components.

3. The method of claim 1, further comprising continuing to alternatingly traverse the state space of the FSM in the first direction and traverse the state space of the FSM in the second direction until a final result is reached.

4. The method of claim 3, further comprising:
   if one or more costs associated with executing a step of the FSM in the first direction exceeds a threshold comprising a maximum cost of executing a step of the FSM:
      discontinuing execution of steps of the FSM in the first direction; and
      continuing execution of steps of the FSM only in the second direction; and
   if one or more costs associated with executing a step of the FSM in the second direction exceeds the threshold:
      discontinuing execution of steps of the FSM in the second direction; and
      continuing execution of steps of the FSM only in the first direction.

5. The method of claim 1, further comprising, prior to executing the one or more first steps of the FSM:
   computing a first image in the first direction and a second image in the second direction opposite the first direction; and
   traversing the state space of the FSM in the first direction before traversing the state space of the FSM in the second direction if one or more costs associated with computing the first image are less than one or more costs associated with computing the second image.

6. The method of claim 1, wherein:
   the second profile indicates one or more costs associated with executing a last step of the FSM in the second direction;
   the one or more second predetermined criteria indicate one or more costs associated with executing a last step of the FSM in the first direction; and
   stopping the traversal of the state space in the second direction according to the comparison between the second profile and the one or more second predetermined criteria comprises stopping the traversal of the state space in the second direction if the one or more costs associated with executing a last step of the FSM in the second direction exceed the one or more costs associated with executing a last step of the FSM in the first direction.

7. The method of claim 1, wherein a step of the FSM comprises an image or preimage computation.

8. The method of claim 1, further comprising, if traversal of the state space in the first direction or the second direction encounters a failing property, computing an error trace to the failing property.

9. One or more tangible computer-readable media comprising instructions when executed by a computer operable to:
   execute one or more first steps of a finite state machine (FSM) corresponding to one or more binary decision diagrams (BDDs) to traverse a state space of the FSM in a first direction with respect to an initial state and an erroneous state;
   automatically and without user input, access a first profile corresponding to the one or more first steps of the FSM;
   automatically and without user input, compare the first profile with one or more first predetermined criteria;
   automatically and without user input, stop the traversal of the state space in the first direction according to the comparison between the first profile and the one or more first predetermined criteria;
   automatically and without user input, execute one or more second steps of the FSM to traverse the state space in a second direction with respect to the initial state and the erroneous state opposite the first direction according to a first partial result from the one or more first steps of the FSM;
   automatically and without user input, access a second profile corresponding to the one or more second steps of the FSM;
   automatically and without user input, compare the second profile with one or more second predetermined criteria;

automatically and without user input, stop the traversal of the state space in the second direction according to the comparison between the second profile and the one or more second predetermined criteria; and automatically and without user input, execute one or more third steps of the FSM to traverse the state space in the first direction from the one or more first steps according to a second partial result from the one or more second steps of the FSM.

10. The computer readable media of claim 9, wherein the one or more BDDs collectively correspond to one or more hardware components, one or more software components, or one or more embedded-logic components.

11. The computer readable media of claim 9, further operable to continue to alternatingly traverse the state space of the FSM in the first direction and traverse the state space of the FSM in the second direction until a final result is reached.

12. The computer readable media of claim 11, further operable to:
if one or more costs associated with executing a step of the FSM in the first direction exceeds a threshold comprising a maximum cost of executing a step of the FSM:
discontinue execution of steps of the FSM in the first direction; and
continue execution of steps of the FSM only in the second direction; and
if one or more costs associated with executing a step of the FSM in the second direction exceeds the threshold:
discontinue execution of steps of the FSM in the second direction; and
continue execution of steps of the FSM only in the first direction.

13. The computer readable media of claim 9, further operable, prior to executing the one or more first steps of the FSM, to:
compute a first image in the first direction and a second image in the second direction opposite the first direction; and
traverse the state space of the FSM in the first direction before traversing the state space of the FSM in the second direction if one or more costs associated with computing the first image are less than one or more costs associated with computing the second image.

14. The computer readable media of claim 9, wherein:
the second profile indicates one or more costs associated with executing a last step of the FSM in the second direction;
the one or more second predetermined criteria indicate one or more costs associated with executing a last step of the FSM in the first direction; and
stopping the traversal of the state space in the second direction according to the comparison between the second profile and the one or more second predetermined criteria comprises stopping the traversal of the state space in the second direction if the one or more costs associated with executing a last step of the F SM in the second direction exceed the one or more costs associated with executing a last step of the FSM in the first direction.

15. The computer readable media of claim 9, wherein a step of the FSM comprises an image or preimage computation.

16. The computer readable media of claim 9, further operable, if traversal of the state space in the first direction or the second direction encounters a failing property, to compute an error trace to the failing property.

17. A system for invariant checking, the system comprising:
means for executing one or more first steps of a finite state machine (FSM) corresponding to one or more binary decision diagrams (BDDs) to traverse a state space of the FSM in a first direction with respect to an initial state and an erroneous state;
means for, automatically and without user input, accessing a first profile corresponding to the one or more first steps of the FSM;
means for, automatically and without user input, comparing the first profile with one or more first predetermined criteria;
means for, automatically and without user input, stopping the traversal of the state space in the first direction according to the comparison between the first profile and the one or more first predetermined criteria;
means for, automatically and without user input, executing one or more second steps of the FSM to traverse the state space in a second direction with respect to the initial state and the erroneous state opposite the first direction according to a first partial result from the one or more first steps of the FSM;
means for, automatically and without user input, accessing a second profile corresponding to the one or more second steps of the FSM;
means for, automatically and without user input, comparing the second profile with one or more second predetermined criteria;
means for, automatically and without user input, stopping the traversal of the state space in the second direction according to the comparison between the second profile and the one or more second predetermined criteria; and
means for, automatically and without user input, executing one or more third steps of the FSM to traverse the state space in the first direction from the one or more first steps according to a second partial result from the one or more second steps of the FSM.

* * * * *

UNITED STATES PATENT AND TRADEMARK OFFICE
CERTIFICATE OF CORRECTION

PATENT NO. : 7,360,186 B2 Page 1 of 1
APPLICATION NO. : 11/119443
DATED : April 15, 2008
INVENTOR(S) : Thomas W. Sidle et al.

It is certified that error appears in the above-identified patent and that said Letters Patent is hereby corrected as shown below:

Column 3, Line 58, before "$TR_2$" delete "((" and insert -- ( --.

Column 3, Line 61, after "k" delete "$\leqq$" and insert -- $\leq$ --.

Column 5, Line 51, after "bwd_cost" delete "$\leqq$" and insert -- $\leq$ --.

Column 6, Line 5, after "from" delete "p" and insert -- *I* --.

Signed and Sealed this

Eighteenth Day of November, 2008

JON W. DUDAS
*Director of the United States Patent and Trademark Office*